United States Patent [19]
Ponto

[11] Patent Number: 5,428,642
[45] Date of Patent: Jun. 27, 1995

[54] POWER AMPLIFIER

[76] Inventor: Robert Ponto, 702 Exmoor Ave., Louisville, Ky. 40223

[21] Appl. No.: 143,624

[22] Filed: Nov. 1, 1993

[51] Int. Cl.⁶ .................. H04K 1/02; H04L 25/03; H04L 25/49
[52] U.S. Cl. .................. 375/297; 375/238; 330/10
[58] Field of Search .......... 332/109; 375/3, 4, 22, 375/58, 60, 76, 59; 455/17, 102, 127; 330/10

[56] References Cited

U.S. PATENT DOCUMENTS

| | | | |
|---|---|---|---|
| 4,092,608 | 5/1978 | Woods | 330/10 |
| 5,126,684 | 6/1992 | Solomon | 330/10 |
| 5,159,283 | 10/1992 | Jensen | 455/127 |
| 5,170,495 | 12/1992 | McNicol et al. | 455/127 |

Primary Examiner—Stephen Chin
Assistant Examiner—Don N. Vo

[57] ABSTRACT

A signal conditioning and signal power amplification system with digital signal attenuation and signal amplification with signal modification by clipping and filtering followed by pulse width modulation. The signal is then amplified and demodulated to generate similar signals in sequence which provide an amplified regenerated signal. A timer system is provided to sequence the phase of signal conditioning and amplification which adds an adjustable dead band to prevent destructive enforcement of the signal.

1 Claim, 8 Drawing Sheets

POWER AMPLIFIER

BACKGROUND OF THE INVENTION

The present invention relates in general to signal modification systems and provides apparatus particularly useful for amplification of audio signals where an audio signal is generated at a location and it is desired to amplify the signal for use.

Signal amplification is well known in the art and various prior art devices have been developed for such purposes in audio arts as well as for other purposes.

In spite of the long term and widespread use of signal attenuation and amplification new demands are consistently made of such equipment in both fidelity and amplification capability.

With the advent of large arenas and public buildings such as airports where public address systems are utilized the need for relatively inexpensive but more importantly, small and efficient audio systems with great capabilities has developed.

The prior art has not developed a small means to efficiently provide high power amplification. Prior art systems where high gain amplification has been achieved have generally been relatively inefficient as compared with devices provided by the present invention as described hereinafter.

SUMMARY OF THE INVENTION

The present invention provides signal conditioning and amplification systems which provide high power amplification of signals, particularly audio signals. Apparatus within the scope of the present invention has the capability of converting such signals to forms which can be successfully amplified efficiently then reconverting the signals to the original format for transmission and broadcast.

Advantageously, apparatus within the scope of the present invention accomplishes the amplification without the generation of self reinforcing signals which can be destructive to the equipment and distort the amplified signals.

Additionally, the present invention provides means for the efficient and highly effective development of amplified audio signals which requires significantly less power than prior art methods. Such efficiency reduces heat generation and allows more compact and less expensive equipment for numerous reasons including a significant reduction in the heat sink requirements of the systems within the scope of the present invention.

Briefly the present invention provides a signal conditioning and signal power amplification system with digital signal attenuation and signal amplification with signal modification by clipping and filtering followed by pulse width modulation. The signal is then amplified and demodulated to generate similar signals in sequence which provide an amplified regenerated signal. A timer system is provided to sequence the phase of signal conditioning and amplification which adds an adjustable dead band to prevent destructive enforcement of the signal.

Examples of arrangements within the scope of the present invention are illustrated in the accompanying drawings and described hereinafter but it will be understood that neither the arrangements shown nor the descriptions thereof are by way of limitation and that other arrangements also within the scope of the present invention will occur to those skilled in the art upon reading the disclosure set forth herein.

BRIEF DESCRIPTION OF THE DRAWINGS

Examples of arrangements within the scope of the present invention are illustrated in the accompanying Drawings where.

DETAILED DESCRIPTION OF THE DRAWINGS

Figure 1:
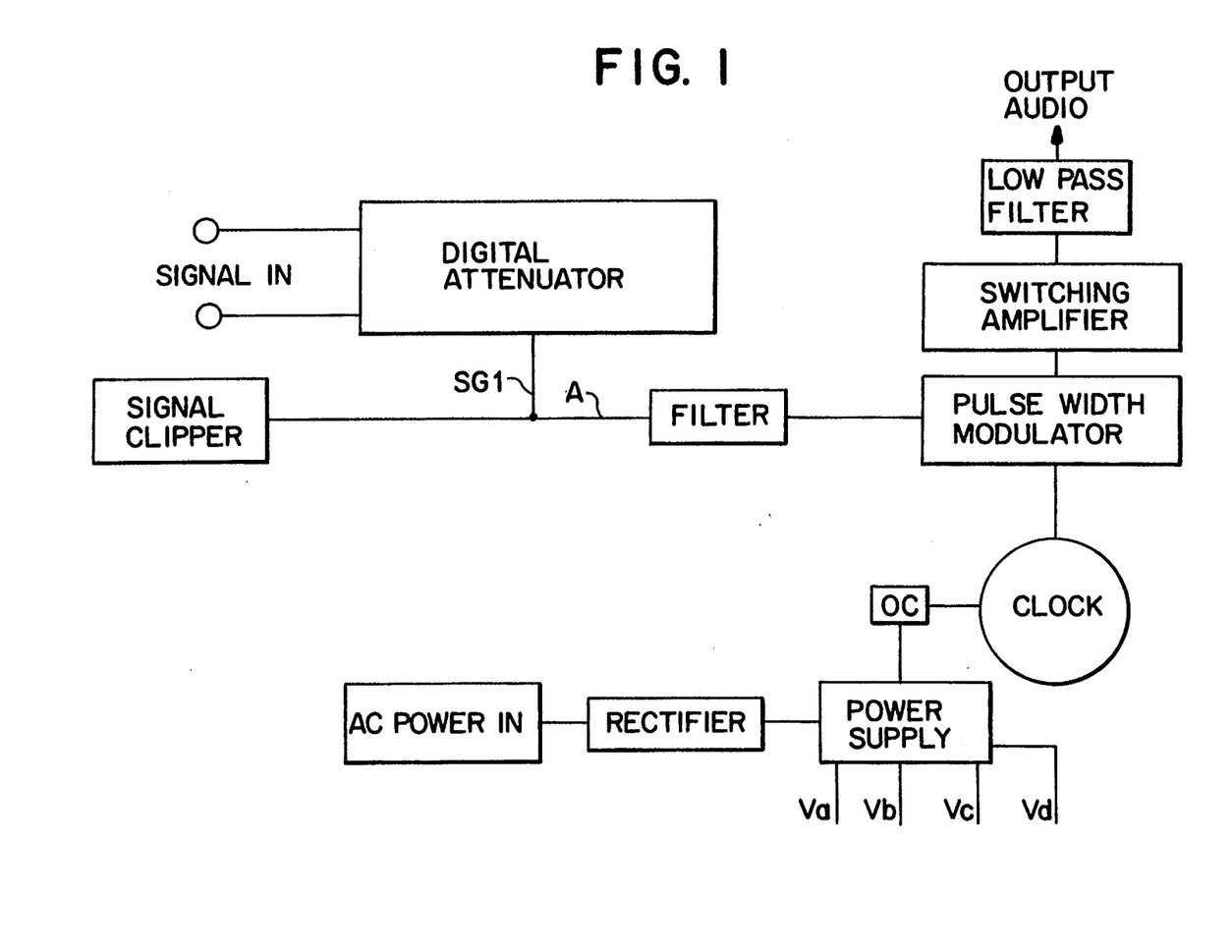
FIG. 1 is a system drawing illustrating generally the features of an example of an arrangement within the scope of the present invention.

Referring first to FIG. 1, a signal input is provided to a digital attenuator which sets the initial gain of the signal such as an audio signal from a microphone or the like to a selected dB range, and provides an attenuated audio signal ASG1.

A signal clipper, an example of which is described hereinafter, is provided to limit the signal. The signal A from the clipper is supplied to a FILTER which can be a multi-pass filter so that only signals of selected characteristics are passed to the processing section described hereinafter.

Signal A from the clipper section is then supplied to a PULSE WIDTH MODULATOR operated by a clock to generate generally square wave signals characteristic of the original audio signal which are supplied to an AMPLIFIER where the square wave signals are amplified and then demodulated to regenerate the original signal but in amplified form.

Figure 1A:
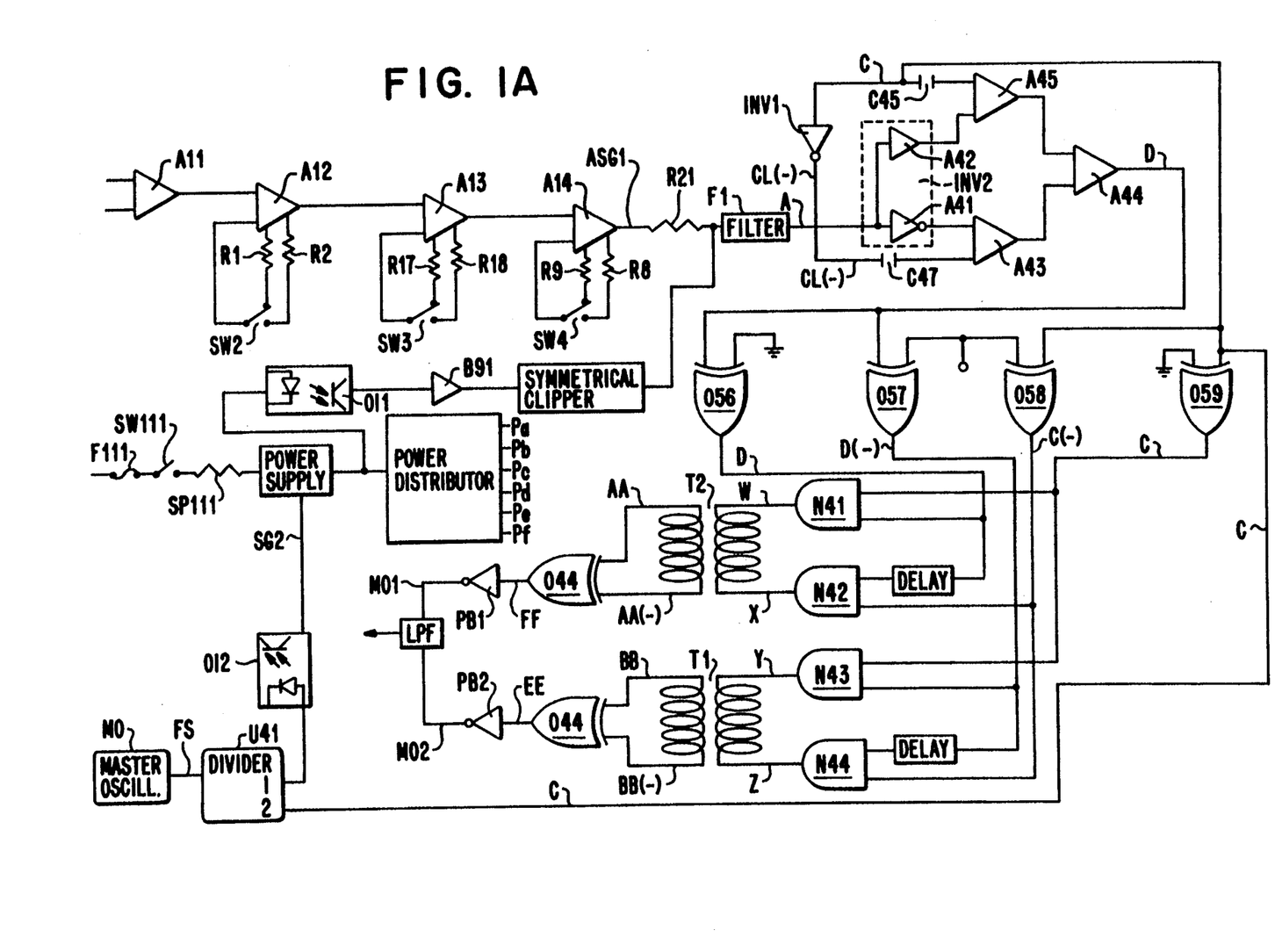
FIG. 1A is a general drawing of the system shown in FIG. 1 in additional detail.

FIG. 1A illustrates the system shown in FIG. 1 with considerable more detail.

In FIG. 1A the signal is supplied to pre-amplifier A11 and to a series of amplifiers A12–A14 where the attenuation of the signal is selected digitally by the positioning of the switches SW2–SW4. The attenuated signal ASG1 is supplied through an adjusting resistor R21 to a filter F1 and the filtered signal A is supplied to the noninverting input of an amplifier A42 (FIG. 3) which is in an inverter INV2 to the inverting input of a second amplifier. A clock signal C described hereinafter is supplied through a decoupling capacitor C47 to the noninverting input of amplifier A43 and through an inverting buffer INV1 (including "OR gates 043 and 044 shown in FIG. 3) and a decoupling capacitor C45 to the noninverting input of amplifier A45.

Figure 1B:
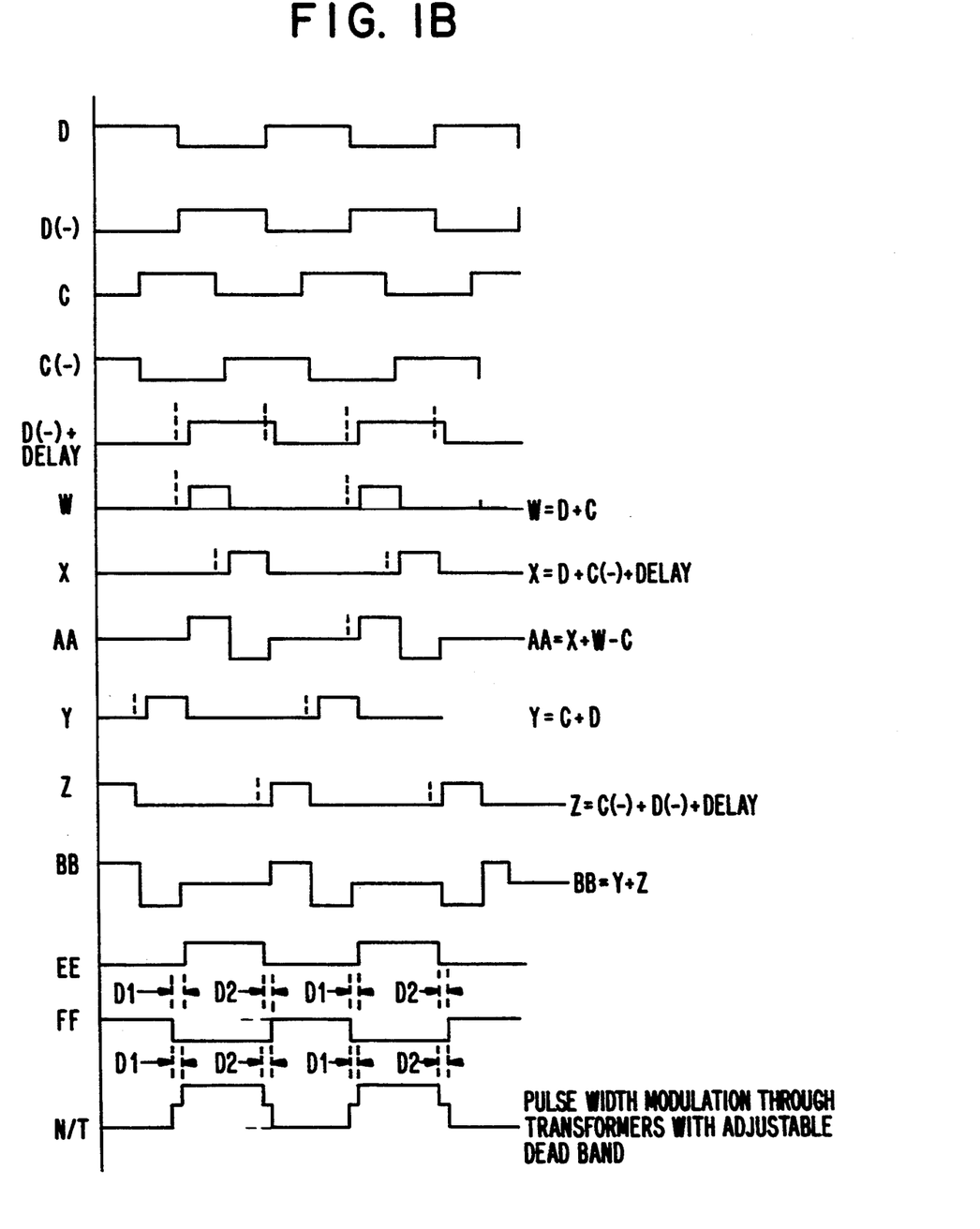
FIG. 1B is a drawing illustrating examples of the form of signals generated in the devices shown in FIGS. 1 and 2.

The outputs of amplifiers A43 and A45 are supplied to a first comparator A44 to generate a pulse width modulated rectangular wave signal D of the type shown in FIG. 1B.

It will also been seen that because the audio signal A and the clock pulses C and C(−) are also supplied to the amplifiers A43 and A45 where the output from comparator D has the characteristics of the clock pulses reinforced by the characteristics of the audio signal.

The signals provide the program content which is then modulated into rectangular pulse width signals.

Signal D is supplied to one of the inputs of each of a pair of exclusive OR gates 056, 057. The other input of gate 056 is grounded and the output of Or gate 056 provides the "D" signal. The other input of gate 057 and one input to another OR gate 058 are connected to a pullup Pa. The output of OR gate 057 provides the "D(−)" signal as shown in FIG. 1B. A fourth exclusive OR gate 059 has one input grounded. The "C" signal is supplied to the other input of OR gates 058 and 059 so the output of OR gate 058 generates the "C(−)" signal and the output of OR gate 059 generates the "C" signal all as shown in FIG. 1B.

The "D", "D(−)", "C(−)" and "C" signals are then supplied through "AND gates N41-N44 with delays introduced on AND gates N42 and N44 to generate the pulse width modulated square wave signals W, X, Y, Z, which can be amplified and demodulated to the amplified program signal.

The delay introduced to AND gate N42 is delayed so a dead band is created to prevent output transistors in the amplification section from conducting simultaneously and destroying themselves. The effective waveform of signal D(−) plus the delay is shown in FIG. 1B. The signals W, X, Y, and Z are supplied to the primary of isolation transformers T1 and T2 where the logic section previously described is effectively isolated from the high voltage and power of the system.

It is recognized that, in devices within the scope of the present invention, all signals from modulator input to load signals are balanced throughout the system.

Signals AA, AA(−), BB, BB(−) are generated which contain pulse width modulates signals not normally obtained in devices of the type provided by the present invention.

One of the unexpected advantages of the present invention is provided by the present invention is that it has been found that audio pulse width modulated signals have no underlying direct current component so, advantageously the entire signal can be passed through transformer means for isolation and enhancement without alteration of the important characteristics of the signal.

The signals AA, AA(−), BB, BB(−) are then supplied to exclusive "OR" gates 044 and 045 to demodulate and generate signals EE and FF so the signals are true pulse width modulated signals with direct current component in two phase balanced form. Signals EE and FF are buffered in buffers PB1 and PB2 to generate an output signal to filter LPF.

A brief description of examples of a power supply and clock system useful in devices in accordance with the present invention is illustrated in FIG. 1A.

The power supply is adapted to generate several different source Pa-Pf as described in more detail hereinafter. The clock system includes a master oscillator MO to generate timing pulses FS at selected frequency. The signal FS is divided in a divider to generate two frequencies. The first signal is supplied through an opto-isolator OI2 to generate a signal SG2 to operate a power supply.

A second opto-isolator OI1 generates an overload signal to the Clipper system. The clipper prevents overmodulation and unexpectedly has no overshoot and provides protection occurances which would destroy the amplifier and has no overshoot. All prior art systems designed for similar purposes frequently overload and destroy speakers.

The second frequency pulse signal from divider U41 generates the Clock signal C.

Figure 2:
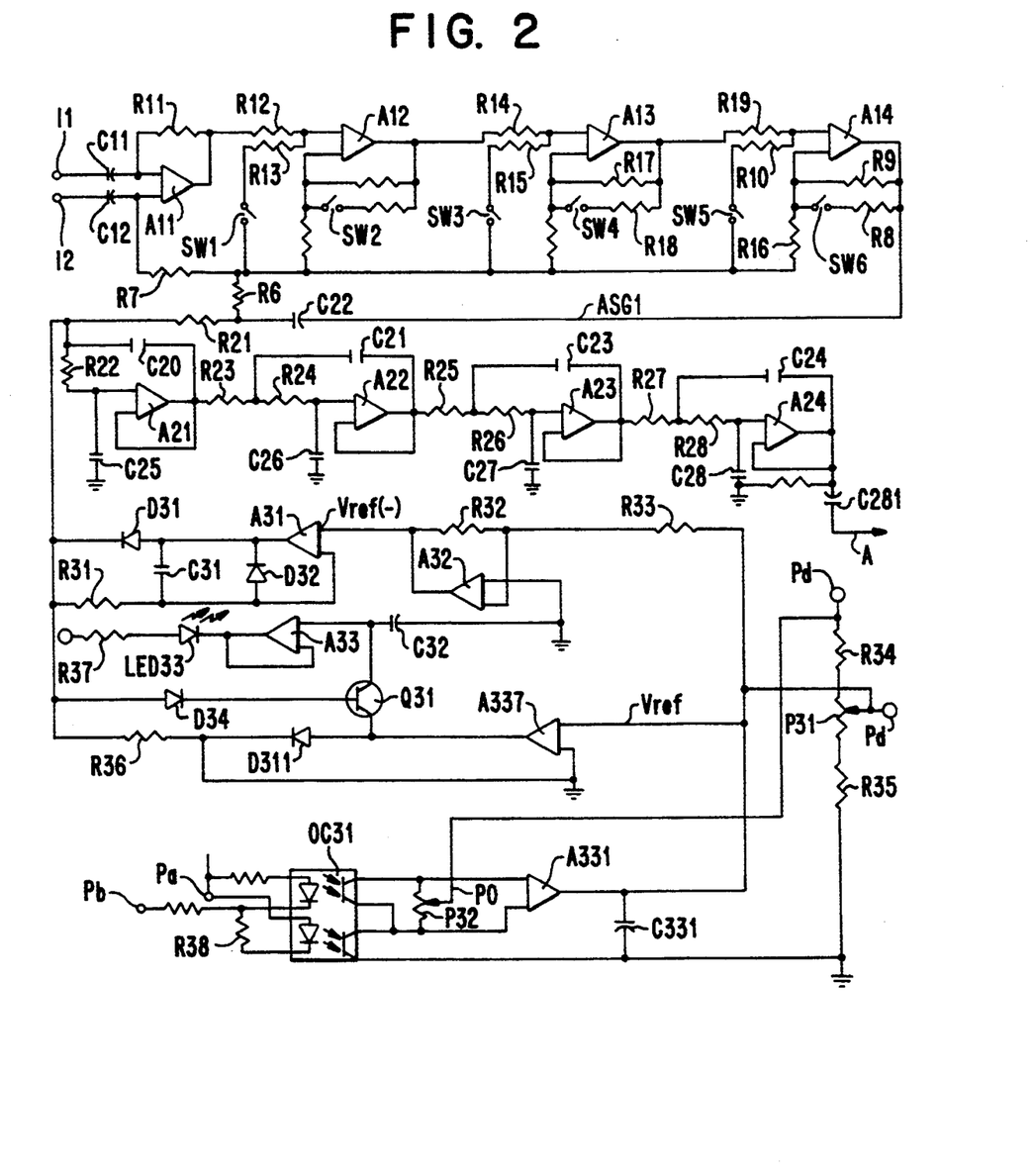
FIG. 2 is a more detailed illustration of an example of a filter and clipper circuit of the type illustrated in FIG. 1A.

FIG. 2 illustrates examples of a signal input section, Clipper and filter sections which can be used in arrangements in accordance with the present invention.

As shown, decoupling capacitors C11,C12 are provided in inputs I1, I2. The switches SW1-SW6 set the gain of the system and within the scope of the present invention any desired number of gain stages can be provided to set the output signal ASG1 level.

The Clipper section includes an opto-isolator OC31 connected with resistors R34, R35 and Potentiometer P31 to source Pd to set the reference signal at the output of comparator A331. The Vref to comparator A331 is also supplied to the inputs of amplifiers A337 and A331 to set the Clipping parameters.

Advantageously, Comparator A331 adjusts Vref only when the power supply is overloaded.

The signal ASG1 is then Clipped and supplied to the input of the first amplifier A21 of the filter section.

The example of the filter shown in FIG. 2 is an active filter configuration utilizing operational amplifiers A21-A24 to generate the Clipped, filtered signal A.

Figure 3:
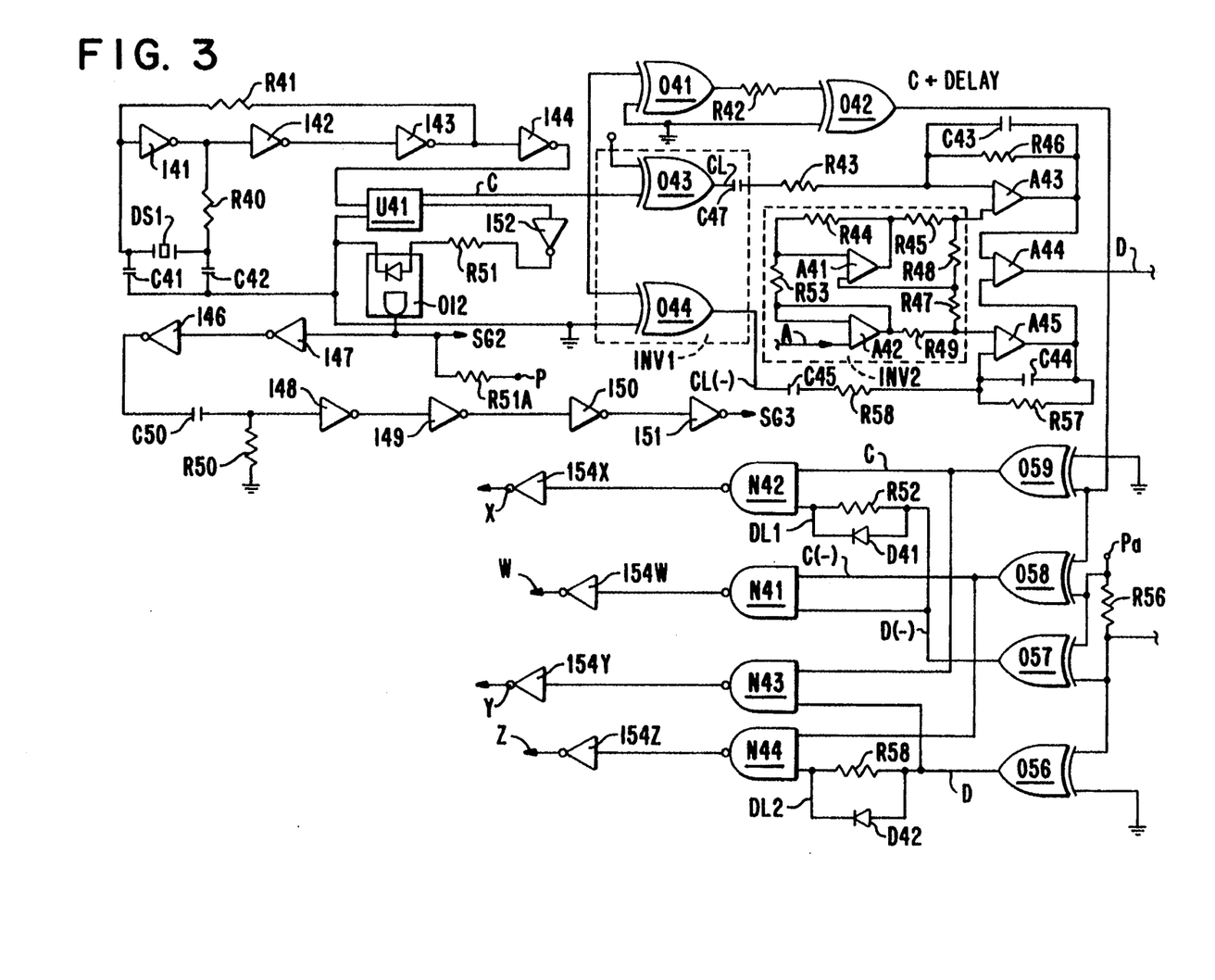
FIG. 3 is a more detailed schematic drawing of an example of a modulator and clock circuit of a type useful in arrangements of the type illustrated in FIG. 1A.

FIG. 3 is a more detailed description of a modulating section for generation of a pulse width modulated audio signal D as shown and the processing of the signal to generate the signals W, X, Y and Z illustrated in FIG. 1B. As previously described the signals W, X, Y and Z are subsequently demodulated to provide the amplified signal.

FIG. 3 illustrates an example of a clock system useful in apparatus within the scope of the present invention to include an integrated circuit counter U41 which generates to clock signal C based on the frequency rate of the oscillator OS1 as set by the buffers 141-144, the resistors R40, R41 and capacitors C41, C42.

As also shown, a second Clock signal is supplied through an inverter I52 to opto-isolator OI2 to generate a signal SG2 supplied to the power supply as shown in FIG. 1A and described in more detail hereinafter to synchronize the audio and power sections to prevent generation of objectionable harmonics in the audio section.

Figure 5:
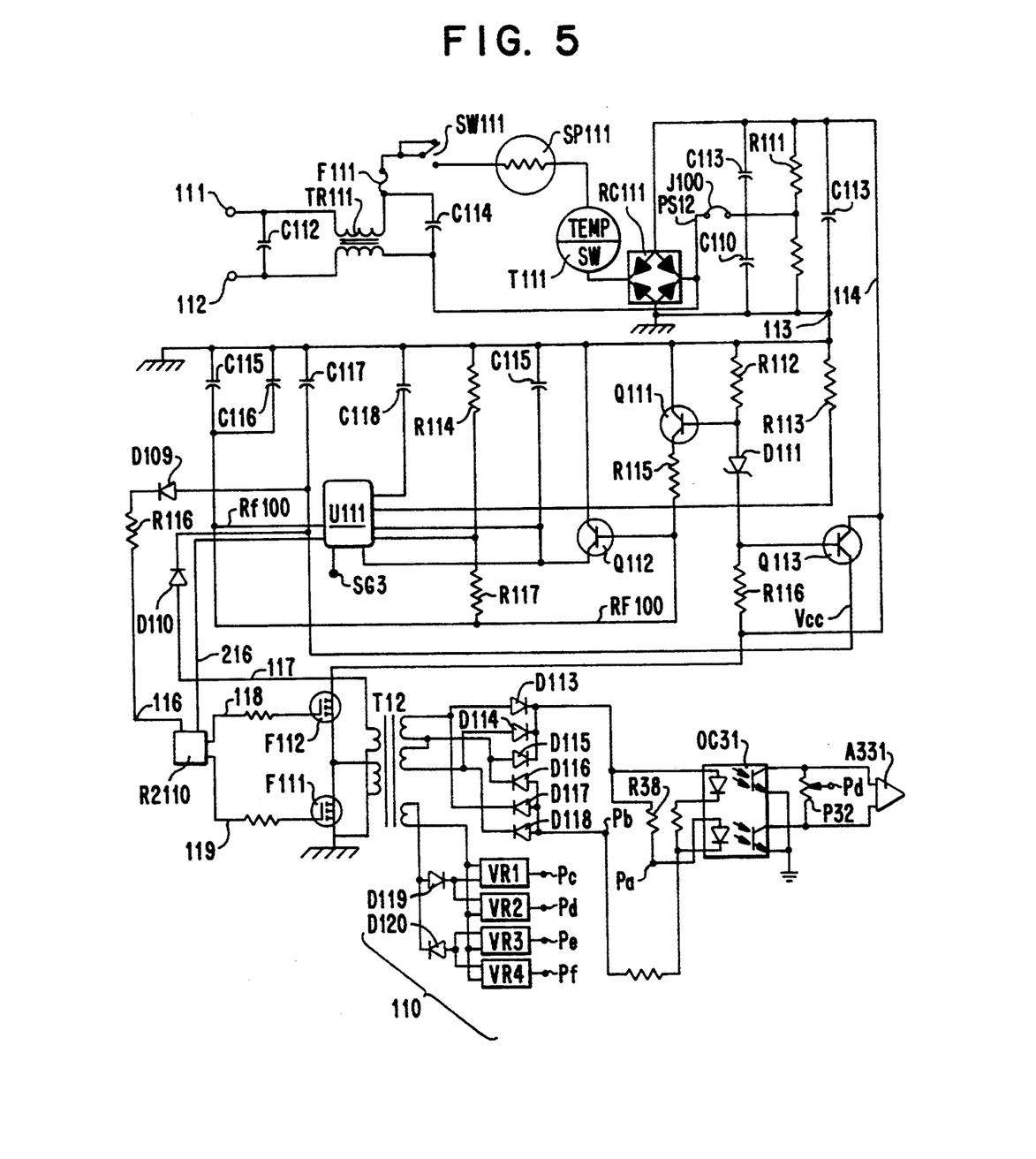

Pullup through resistor R51A is also supplied through the buffers 146,147 and a capacitor C50 resistor R50 to ground and to buffers 148-151 which increase the signal value and generate signal SG3 also supplied to U111. (FIG. 5)

As shown in FIG. 1A the clock pulse C is also supplied to "OR" gates 041-043.

"OR" gate 044 also receives the signals from counter U41 so that the output of "OR" gate 044 cannot be high when both Clock pulses are present and generates an inverted Clock pulse C(−) supplied through a ramp circuit including capacitor C 44 and resistor R57 to the inverting input of amplifier A45.

The elements A41, A42, R44, R45, R47, R48, R49 R53 all form a balanced signal attenuator shown as INV2 in FIG. 1A. Signal A is admitted to the system, attenuated and output to amplifier A43. The signal is inverted and supplied to amplifier A45. Amplifier A45 and capacitor C44 define an integrator driven from current source through resistor R56 to generate a triangular waveform with a period C. Resistor R57 and capacitor C45 provide the bias.

The triangular waveform appears on the output of amplifier A45 and is modulated by the audio signal. A complimentary signal is generated at the output of amplifier A43. Both outputs are supplied to comparator A44 and generate the pulsewidth modulated signal D.

Signal D is supplied through a pullup resistor R56 to the inputs of "OR" gates 056–058 as illustrated. The clock signal C+(DEL) is supplied to "OR" gates 057–059 to generate the C and C(−) signals as shown.

The outputs from OR gates 056, 057 provide the D(−) and D signals respectively as shown in FIG. 1B.

The C signal is then supplied to AND gates N42 and N43 in inverse order while the C(−) signal is supplied to gates N41 and N44. The D(−) output is supplied to AND gate N42 through delay DL1 including resistor R52 and diode D41.

The output of AND gate N41 is supplied through a buffer 154W to generate the signal W.

The D(−) signal is also supplied to AND gate N42 and then through a buffer 154X to generate the X signal shown in FIG. 1B.

The D signal is supplied through another delay DL@ including resistor R58 and diode D42 to provide the desired delay to AND gate N44 which generates the signal Z from buffer 154Z.

As shown the C signal is supplied to AND gate N43 to generate the Y signal through buffer 154Y.

The signals W, X, Y, Z represent the initial audio signal in modified pulse width modulated form with co-operative relatively positive and negative components and signal strength because of the buffering to allow the signals to drive the primary of a 1:1 transformer as described hereinafter to regenerate the original audio signal with remarkable fidelity and enhanced power.

Figure 4A:
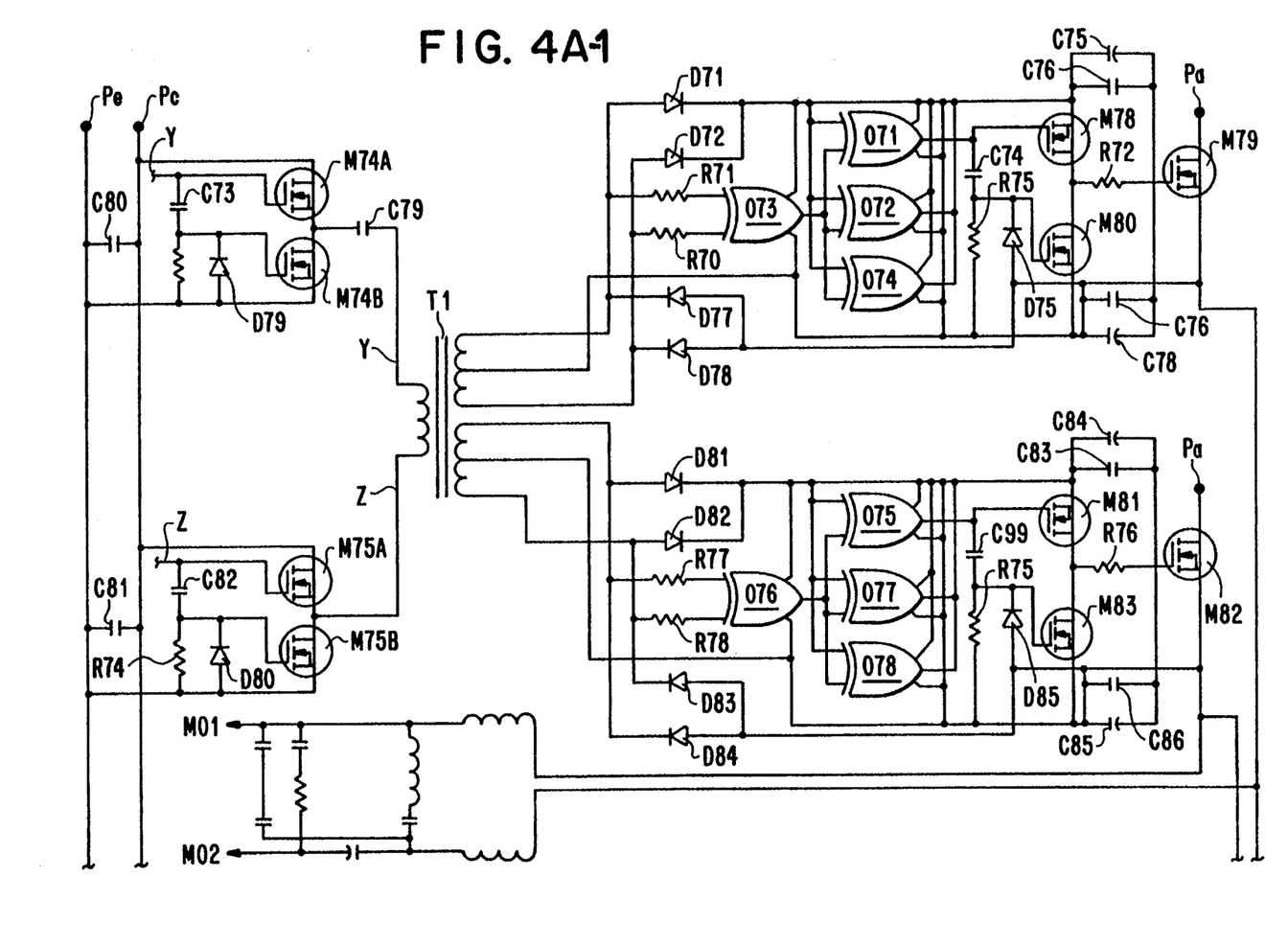
FIG. 4 is a more detailed schematic drawing of an example of an amplifier and demodulator circuit of a type useful in arrangements of the type illustrated in FIG. 1A; and, FIG. 5 is a more detailed schematic drawing of an example of a power circuit of a type useful in arrangements of the type illustrated in FIG. 1A.
Figure 4A:
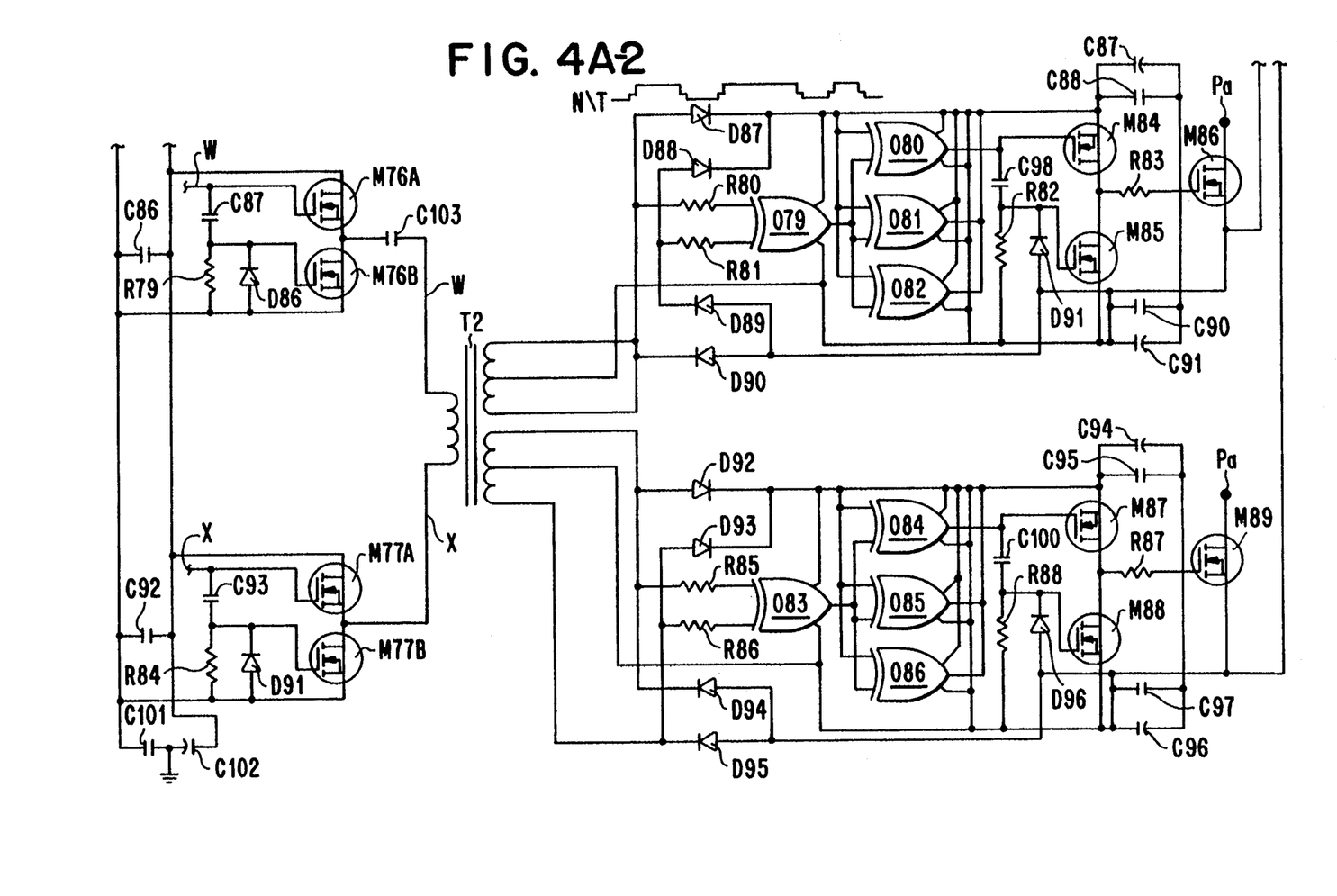

As shown in FIG. 4 the Y and Z signals from buffer 154y AND 154z are provided to the gates of FET's M74A M74B and M75A, M75B respectively.

In accordance with one feature of the present invention the-arrangement is duplicated with FET's M76A, M76B M77A and M77B as shown which receive the W and X signals.

In each case, for example in the case of the M74A, M74B and M75A, M75B the M74A and M74B transistors and the M75A and M75B transistors are complimentary, that is one is P channel and one is N channel. In the arrangement the Y signal turns on one, for example the M74A FET and turns off the complimentary FET M74b. Simultaneously the Z signal turns off M74A and turns on M75B. The effect is to provide a push-pull driver which is AC coupled to the two rails Pe Pc and with the similar output from FET's M75A, M75b which operate in the same fashion generates a modulated pulse width modulated (twice modulated) signal which drives the primary of transformer T1.

The outputs of FET's M74A, M74B are supplied through a decoupling capacitor C79

A similar situation occurs at the primary to transformer T2. The result is a balanced signal to the demodulating sections driven by the secondary of the transformers T1 and T2. The secondary of each of the transformers is split and supplied to a separate AND gate equivalent section through biasing diodes, for example diodes D71–D78 where the section includes OR gates and FET Pairs, for example M78 and M80 which are "P" and "N" transistor pairs to provide "push-pull" operation. The OR gate sections operate power FET's M79, M82, M86 and M89 to amplify the pulse width modulated signals.

Signals EE and FF are supplied to FET's M79, M86 and M82, M89 respectively to generate the amplified pulse width modulated signals APWM1 and APWM2. The delays shown in the EE and FF signals in FIG. 1B are introduced by the delays DL1 and DL2 shown in FIG. 4. The delays are provided to prevent FET M79 from turning on before FET M89 has turned "OFF". Similarly, FET M82 is prevented from turning "ON" before FET M86 has turned "OFF".

The APWM1 and APWM2 signals are supplied to a low pass filter LPF. It has been unexpectedly found that the characteristics of the filter are important to the operation of the system. Particularly, it has been found that for best performance the filter must be less than a third order filter because use of filters of higher order leads to oscillation from feedback due to excessive phase delay.

As shown in FIG. 5 Power is supplied to the unit by means of input terminals 111,112 through a filter transformer TR111. A power switch SW111 is provided with one leg out of the transformer supplied through a surge protector SP111 and a Temperature switch T111 to a rectifier RC111.

A jumper J100 is provided to allow operation from 110 VAC or 220 VAC inputs.

The output rails 113,114 from the rectifier are supplied to the adjusting circuit for controller U111 which switches the field effect transistors FETs F111,F112.

Transistor Q111 is provided to generate a reference signal Rf100 which is supplied to U111 to provide a turn on delay to allow the power to reach maximum before controller U111 starts.

The gate voltage for Transistor Q111 is determined by the voltage drop between rails 113,114 adjusted by resistors R112, R116 and zener diode D111. Transistor Q113 is provided to power controller U111 during turnon before Vcc can be supplied and is gated by base voltage determined by resistors D111, R113, R116 and zener diode D111. Transistor Q113 is gated by U111.

Transistor Q112 is gated by transistor Q111 where transistor Q112 is connected as an inverting buffer to controller U111.

An input 117 is provided from the primary of transformer T12 to controller U111 which provides a power source for Vcc with diode D110 and capacitor C117. Power for IR2110 is supplied from source 116.

Field Effect Transistors F111 and F112 are operated in "push-pull" relation by signals 118, 119 from IR 2110 which is a buffer/driver for signal 216 from controller U111 to generate the primary current to a transformer T12 with split primary windings to supply power to controller U111.

The rate of oscillation of the gate signals 118, 119 is determined by the combination of controller U111, power source 116, IR2110, sources 118,119 to FET's F111 and F112 which furnish the primary of transformer T12.

As shown, transformer T12 can have multiple secondary windings to generate several voltages needed for operation of the unit. A bridge rectifier including diodes D113–D118 is used to the voltage outputs Pa, Pb. A single stage rectifier including diodes D119, D120 provides rectified current to voltage regulators VR1–VR4 to generate the voltages Pc–Pf.

The power supply arrangement shown is unique in that it is self powered with Transistor Q113 providing power ONLY during startup and shuts off as soon as T12 commences to supply power to controller U111 and IR110.

The invention claimed is:

1. A signal power amplification system including: signal input means to receive an analog program signal;
 multistage amplification means with digital gain control means to generate a first amplified program signal;
 pulse width modulation means including first and second amplifier means each having signal input means to receive said first amplified program signal and clock pulse input means, inverter means to invert the program signal supplied to said signal input means of said second amplifier means, and output means to supply first and second output signals where the second output signal of said second amplifier is inverse to the first output signal of said first amplifier means;
 clock means to sequentially generate relatively positive and negative clock pulses to said clock pulse input means of said first and second amplifier means to generate first and second square wave pulse signals indicative of said analog program signal;
 comparator means having input means to receive said first and second square wave signals and generate third square wave signals;
 first modulation means having inverter means to receive said third square wave signals and invert said third square wave signals to provide a fourth square wave signal inverse to said third square wave signal;
 delay means to selectively delay transmission of said third and fourth square wave signals to provide delayed third and fourth square wave signals;
 first, second, third and fourth AND gate means where said first AND gate means receives said positive clock pulse and said third square wave signal and generates a first square wave program signal, said second AND gate means receives said delayed third square wave signal and said negative clock pulse to generate a second square wave program signal inverse to said first square wave program signal; said third AND gate means receives said fourth square wave signal and said negative clock pulse to generate a third square wave program signal; and said fourth AND gate means receives said delayed fourth square wave program signal and said negative clock pulse to generate a fourth square wave program signal inverse to said third square wave program signal;
 first transformer means having primary coil means to receive said first and second square wave program signals and secondary coil means to generate first output program signal and second transformer means having primary coil means to receive said third and fourth square wave program signals and secondary coil means to generate second program signals inverse to said first output program signal; and
 demodulation means to receive said first and second output program signals and generate a signal corresponding to said input analog signal.

* * * * *